(12) United States Patent
Chen

(10) Patent No.: US 7,315,190 B1
(45) Date of Patent: Jan. 1, 2008

(54) PWM CIRCUIT AND PWM INTEGRATED CIRCUIT FOR USE IN PWM CIRCUIT

(75) Inventor: Isaac Y. Chen, Jhubei (TW)

(73) Assignee: Richtek Technology Corp., Hsin-Chu (TW)

( * ) Notice: Subject to any disclaimer, the term of this patent is extended or adjusted under 35 U.S.C. 154(b) by 25 days.

(21) Appl. No.: 11/454,459

(22) Filed: Jun. 16, 2006

(51) Int. Cl.
*H03K 3/017* (2006.01)
(52) U.S. Cl. .................................... 327/172; 327/175
(58) Field of Classification Search ............... None
See application file for complete search history.

(56) References Cited

U.S. PATENT DOCUMENTS

| 5,075,634 | A | * | 12/1991 | French | 330/146 |
| 6,147,526 | A | * | 11/2000 | Skelton et al. | 327/134 |
| 7,026,851 | B2 | * | 4/2006 | Yang et al. | 327/172 |
| 7,199,643 | B2 | * | 4/2007 | Nalbant | 327/538 |
| 2003/0174005 | A1 | * | 9/2003 | Latham et al. | 327/172 |
| 2006/0022732 | A1 | * | 2/2006 | Leung et al. | 327/172 |
| 2006/0028257 | A1 | * | 2/2006 | Huang et al. | 327/175 |
| 2006/0097765 | A1 | * | 5/2006 | Asada | 327/172 |

* cited by examiner

*Primary Examiner*—Cassandra Cox
(74) *Attorney, Agent, or Firm*—Tung & Associates

(57) ABSTRACT

The present invention discloses a PWM integrated circuit which may receive a programming signal without any extra pin. The PWM integrated circuit comprises: a comparator having two outputs; two pins respectively electrically connected with the two outputs; and a programming unit electrically connected with at least one of the two pins for setting a parameter inside the PWM integrated circuit. The two pins of the PWM integrated circuit may be used to respectively control a control switch and a synchronous switch, constituting a PWM circuit for generating PWM signals.

34 Claims, 8 Drawing Sheets

US 7,315,190 B1

PWM CIRCUIT AND PWM INTEGRATED CIRCUIT FOR USE IN PWM CIRCUIT

BACKGROUND OF THE INVENTION

1. Field of the Invention

The present invention relates to a PWM (Pulse Width Modulation) circuit, and in particular to a PWM integrated circuit capable of receiving an external programming signal without any extra pin, and a PWM integrated circuit for use in such a PWM circuit.

2. Description of the Related Art

As shown in FIG. 1, a conventional PWM circuit comprises a comparator 10. An output voltage at the output terminal Vo is sampled by a voltage sampler circuit 20, and compensated by a compensation circuit 30; the output of the compensation circuit 30 is sent to an input terminal of the comparator 10, to be compared with a reference sawtooth wave and generate comparison output signals thereby, for controlling the operations of a control switch CTL_SW and a synchronous switch SYN_SW. The output voltage at the terminal Vo, after sampled by the voltage sampler circuit 20, is also fed back and compared with a reference voltage Vr, to more accurately control the positive input of the comparator 10. The operations of the switches CTL_SW and SYN_SW, through an inductor L, control the duty cycle (i.e., the pulse width) of an output square wave generated at the output terminal Vo. The output voltage may be used to support either or both of loads U_Load and L_Load (schematically shown for purpose of illustration only), according to circuit design requirements. The details of a PWM circuit are well known to one skilled in this art, and therefore are not further explained here.

In the above-mentioned circuit, the circuit elements encompassed by the dash line 100 are usually integrated in an integrated circuit, while the elements outside the dash line 100 are usually made from discrete devices. In the present invention, the complete circuit is referred to as "a PWM circuit", while the partial circuit integrated into an integrated circuit is referred to as "a PWM integrated circuit", which constitutes an essential part of a PWM circuit. The PWM integrated circuit 100 communicates with external circuit elements through pins. As shown in the figure, the integrated circuit 100 requires at least six pins P1-P6 to communicate with external circuit elements, including: a pin P1 electrically connecting with a voltage source Vs for supplying a relatively high voltage to the comparator 10; a pin P2 electrically connecting an output of the comparator 10 to the control switch CTL_SW for controlling its operation; a pin P3 receiving a voltage level from the node SW between the switches CTL_SW and SYN_SW, for supplying a reference voltage level to the comparator 10; a pin P4 electrically connecting another output of the comparator 10 to the synchronous switch SYN_SW for controlling its operation; a pin P5 for receiving the output from the compensation circuit 30; and a pin P6 for receiving the feedback signal from the voltage sampler circuit 20.

In addition to the above-mentioned pins, in a PWM circuit, it is usually required to avoid over current at the node SW, and therefore it is required to detect the current status at the node SW and provide a corresponding feedback control based thereon. There are two conventional ways to do so. As shown in FIG. 1, one conventional way is to provide a constant current source Ioc inside the PWM integrated circuit 100, and a resistor R1 outside the PWM integrated circuit. The resistance of the resistor R1 may be determined according to an over current threshold given by a user of the PWM circuit. By means of the constant current source Ioc and the resistor R1, a predetermined voltage is provided at the node Voc1. As shown in the figure, the predetermined voltage, after properly adjusted, is compared with the voltage level at the node SW by a comparator 40. (Thus, the so-called "over current threshold" is actually embodied in the form of a voltage comparison.) The comparison by the comparator 40 generates an output signal OCP which may be used to trigger over current protection, such as turning off certain switches.

Another conventional way is shown in FIG. 2. The integrated circuit 100 internally generates a reference voltage Voc2, which is input to a comparator 50. The voltage level at the node SW, minus a voltage drop by the resistor R2 (whose resistance may similarly be determined based on the over current threshold given by a user), is provided to another input terminal of the comparator 50. The comparison by the comparator 50 similarly generates an output signal OCP to trigger over current protection.

The above-mentioned conventional PWM circuits have a drawback that an additional pin P7 is required for over current protection, which is not desired. The pin number of an integrated circuit should be as few as possible.

Another drawback of the conventional PWM circuit is that, it is not possible to program the internal circuit inside the PWM integrated circuit unless an additional pin is provided.

In view of the foregoing drawbacks, the present invention proposes a PWM circuit and a PWM integrated circuit, which are capable of receiving an over current threshold setting, or other external programming signals, without any extra pin.

SUMMARY OF THE INVENTION

A first objective of the present invention is to provide a PWM circuit capable of receiving an external programming signal without any extra pin.

A second objective of the present invention is to provide a PWM integrated circuit for use in the PWM circuit.

To achieve the foregoing objectives, according to an aspect of the present invention, a PWM circuit comprises: (1) a first and a second switches electrically connected with each other through a node between them, the node being capable of providing a voltage signal; (2) a PWM integrated circuit, including (2a) a plurality of pins including a first pin for controlling the first switch, a second pin for controlling the second switch, and a third pin for receiving the voltage signal from the node; and (2b) a programming unit electrically connected with one of the first or second pin for receiving a programming signal transmitted through the one pin to program a parameter of the PWM circuit; and (3) a parameter setting circuit electrically connected with the one pin.

According to another aspect of the present invention, a PWM circuit comprises: (1) a first and a second switches electrically connected with each other through a node between them, the node being capable of providing a voltage signal; (2) a PWM integrated circuit, including (2a) a plurality of pins including a first pin for controlling the first switch, a second pin for controlling the second switch, and a third pin for receiving the voltage signal from the node; and (2b) a programming unit electrically connected with the first and second pins for receiving a programming signal transmitted through one of the first or second pin to program a parameter of the PWM circuit; and (3) a parameter setting circuit electrically connected between the first and second pins.

According to a further aspect of the present invention, a PWM integrated circuit comprises: (1) a comparator generating at least two outputs; (2) at least two pins electrically connected with the two outputs, respectively; and (3) a programming unit electrically connected with at least one of the first and second pins for receiving an external programming signal to program a parameter of the PWM integrated circuit.

The programming unit described in the foregoing paragraphs is capable of switching between an normal operation mode and a programming mode. In the normal operation mode, the programming unit transmits internal signals in the PWM integrated circuit to the pin connected with the programming unit, while in the programming mode, the programming unit receives an external programming signal.

Preferably, the programming unit comprises a storage circuit to store the programming signal and to output the stored programming signal for parameter setting. Before storage, preferably, the analogue programming signal is first converted into a digital signal.

For better understanding the objects, characteristics, and effects of the present invention, the present invention will be described below in detail by illustrative embodiments with reference to the attached drawings.

DESCRIPTION OF THE PREFERRED EMBODIMENT

Figure 3:
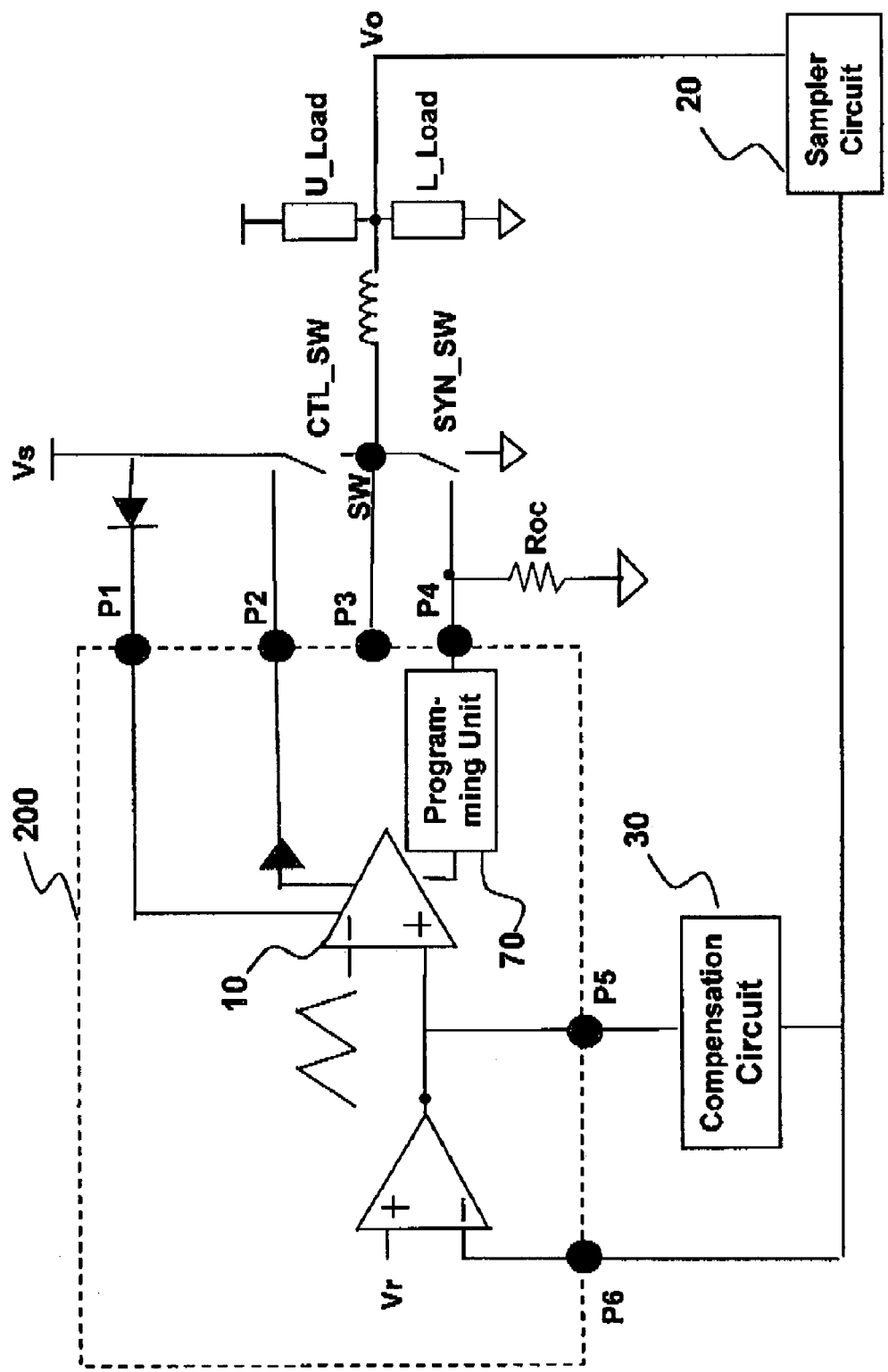
FIG. 3 is a circuit diagram schematically showing a PWM circuit according to a preferred embodiment of the present invention.

Referring to FIG. 3 which schematically shows a preferred embodiment according to the present invention, a PWM integrated circuit 200 comprises a programming unit 70 electrically connected between the lower output of the comparator 10 and the pin P4 for controlling the synchronous switch SYN_SW. (In this paragraph, we first explain the function of the programming unit 70, while the detailed circuit structure of the programming unit 70 will be described later with respect to FIG. 5.) The programming unit 70 has two modes: a programming mode and an normal operation mode. In the programming mode, the programming unit 70 serves to set/program a parameter, such as an over current threshold or other programmable parameters, in the integrated circuit 200. After the setting/programming is done, the programming unit 70 may be switched to the normal operation mode wherein the programming unit 70 becomes a normal driver gate transmitting the output of the comparator 10 to the synchronous switch SYN_SW.

From outside the PWM integrated circuit 200, a user sets an over current threshold or programs other parameters by determining the resistance of the resistor Roc. However, there is a significant difference between this embodiment and the conventional PWM circuit in that no additional pin is required; the setting/programming is achieved by means of the existing pin P4.

Figure 4:
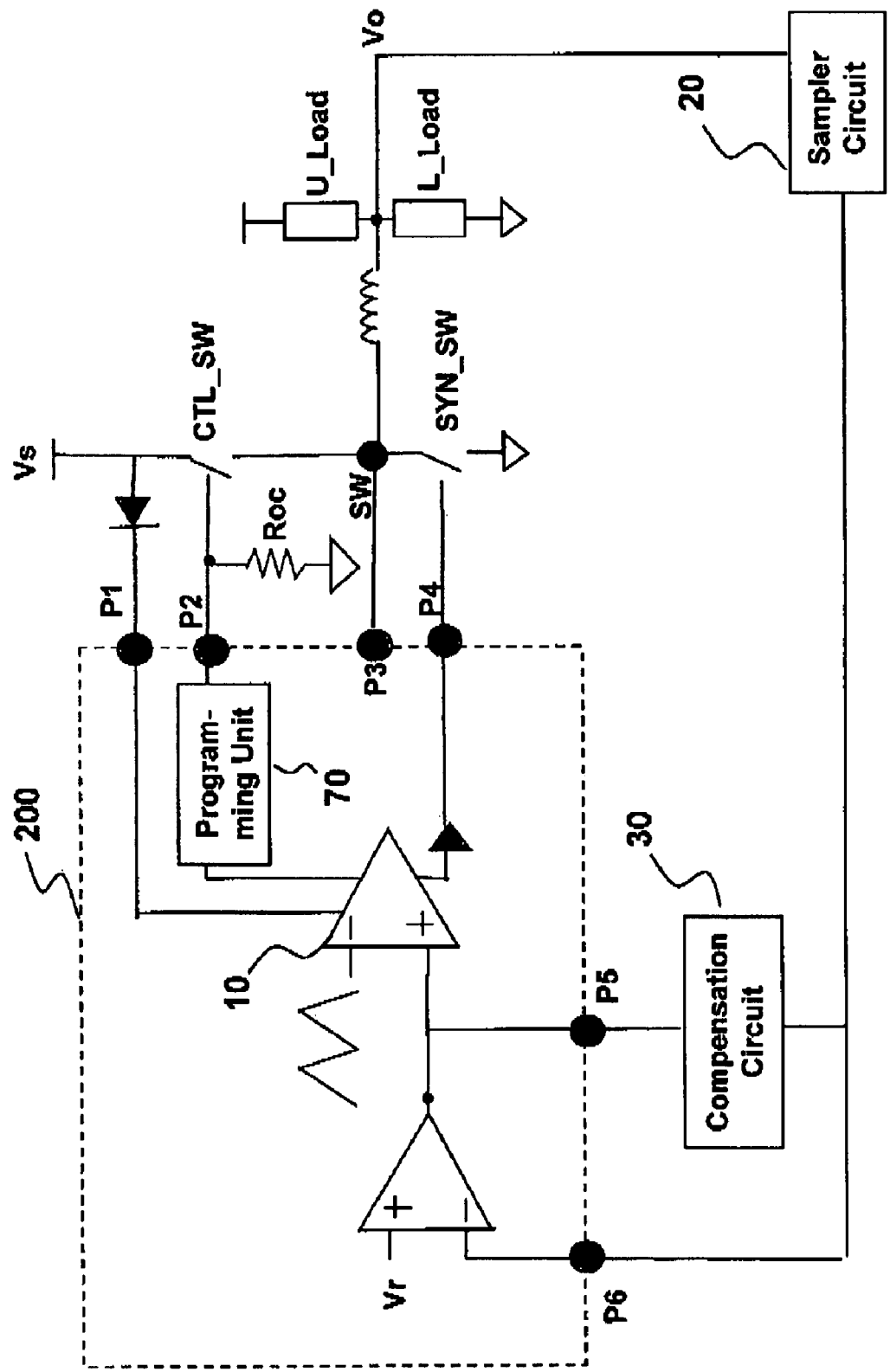
FIG. 4 is a circuit diagram schematically showing a PWM circuit according to another preferred embodiment of the present invention.

FIG. 4 shows another embodiment according to the present invention. As shown in the figure, the programming unit 70 is electrically connected between the upper output of the comparator 10 and the pin P2 for controlling the control switch CTL_SW. In this embodiment, no additional pin is required; the setting/programming is achieved by means of the existing pin P2.

Figure 5:
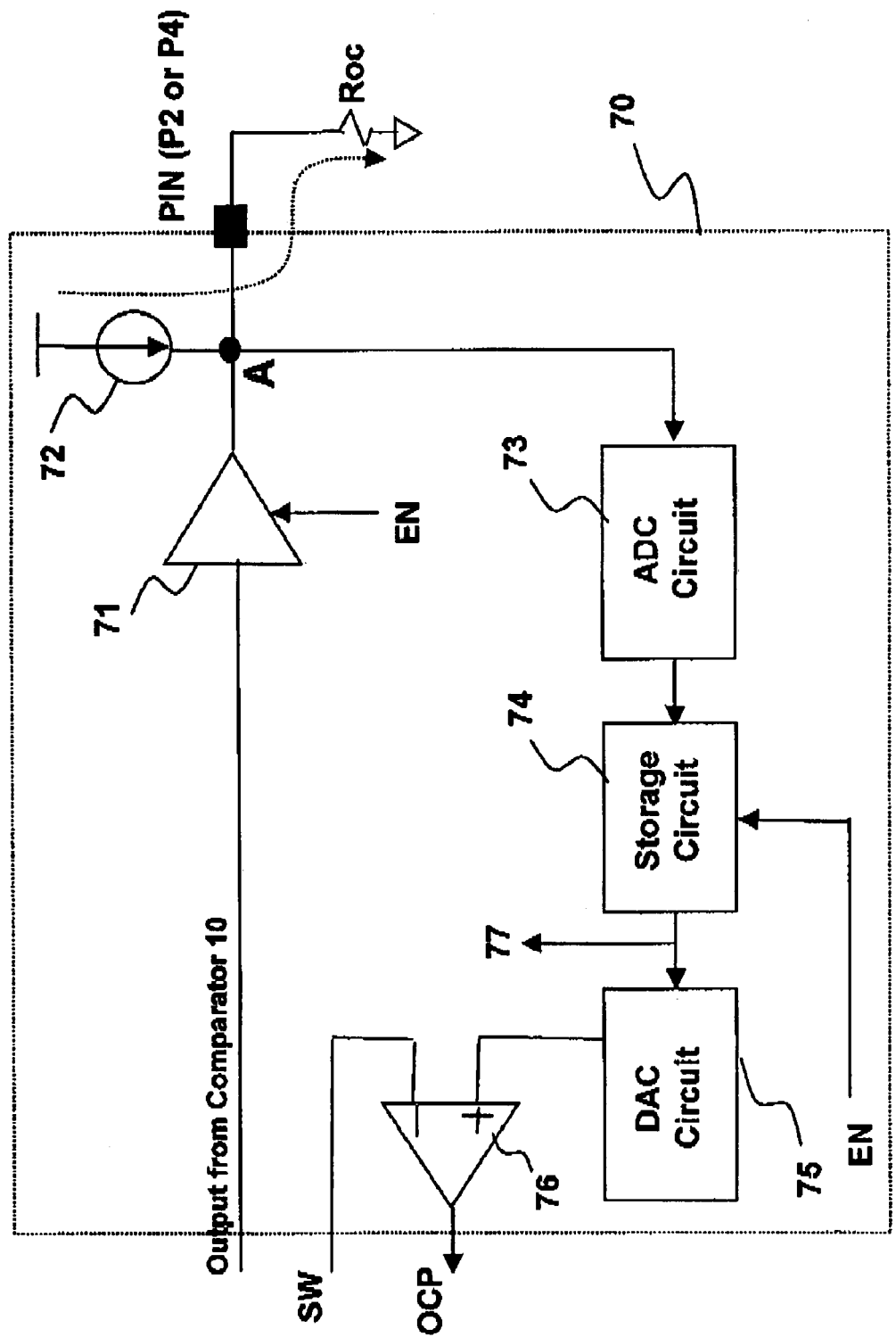
FIG. 5 is a circuit diagram schematically showing the programming unit in the embodiments shown in FIGS. 3 and 4.

The detailed circuit structure of the programming unit 70 is now described with respect to FIG. 5. As shown in the figure, the programming unit 70 includes a tri-state driver gate 71, which receives an output of the comparator 10 (which could be the upper output or lower output of the comparator 10, depending on which embodiment the programming unit 70 is applied to) and transmits the output to a pin PIN, which could be the pin P4 in FIG. 3, or the pin P2 in FIG. 4. The tri-state driver gate 71 is controlled by an enable signal EN. When the enable signal EN is in an "enable" state, the programming unit 70 is set to the normal operation mode wherein the tri-state driver gate 71 allows the output from the comparator 10 to pass through it and reach the pin PIN. When the enable signal EN is in a "disable" state, the programming unit 70 is set to the programming mode wherein the output terminal of the tri-state driver gate 71 is floating, i.e., the node A is not affected by the tri-state driver gate 71, but is controlled by the other part of the circuit.

When the programming unit 70 is set to the programming mode, a constant current source 72 provides a constant current which flows to ground through the path: node A-pin PIN-resistor Roc-ground. Thus, a voltage across the resistor Roc is generated, which is the voltage at the node A.

The voltage across the resistor Roc is for use to compare with the voltage at the node SW and to generate an over current protection signal thereby. However, during normal operation mode, the tri-state driver gate 71 is required to transmit the output from the comparator 10, whereas the voltage at the node A should thus be controlled by the output of the tri-state driver gate 71. Therefore, it is not preferred to directly compare the voltage at the node A with the voltage at the node SW by a comparator 76, for the reason that the voltage value set by the constant current source 72 and the resistor Roc would be lost during normal operation mode. It is preferred that the voltage value set by the constant current source 72 and the resistor Roc in the programming mode is first stored, and the stored voltage value may then be used for comparison. There are many possible ways to store a voltage value, as well known to one killed in this art; for example, a voltage value may be stored in its analogue form. According to a preferred embodiment of the present invention, as shown in the figure, the voltage at the node A is first converted into a digital value by an ADC (Analogue-to-Digital Converter) circuit 73, and next stored in a storage circuit 74. The storage circuit 74 receives the same enable signal EN as the tri-state driver gate 71; when the enable signal EN is in a "disable" state, the storage circuit 74 receives data input, but when the enable signal EN is in an "enable" state, the storage circuit 74 latches data and does not accept any new data input from the ADC circuit 73. The digital data stored in the storage circuit 74 is output to a DAC (Digital-to-Analogue Converter) circuit 75 and converted into an analogue signal thereby. The output of the DAC circuit 75 is input to the positive terminal of a comparator 76 to be compared with the voltage at the node SW, for generating an over current protection signal OCP.

In the above-mentioned embodiment, the ADC circuit 73 and the DAC circuit 75 may be a very simple circuit providing conversion of only one bit, or a relatively complex circuit capable of providing conversion of N bits (N being an integer), depending on the requirements of the PWM circuit. There are many possible ways to embody the ADC circuit 73 and DAC circuit 75; as an example, one may refer to the circuit described in U.S. Pat. No. 7,042,773. The details thereof are omitted here.

In comparison with direct storage of an analogue voltage value, the foregoing embodiment which converts the analogue voltage value at the node A into a digital data, and next stores the data in digital form, provides an advantage that the stored data will not be lost after a long time. In addition, there is another advantage. The voltage at the node A is not input to the comparator 76 directly, but instead, it has to be A-to-D converted, stored, and D-to-A converted. Thus, the voltage across the resistor Roc does not has to be exactly the same as or substantially have an 1:1 correspondence with the voltage to be input to the comparator 76. The voltage at the node A and the voltage to be input to the comparator 76 may be arranged to be any ratio, by properly designing the conversion ratio of the ADC circuit 73 and DAC circuit 75. This provides an advantage that the error tolerance of the resistor Roc is enlarged. For example, if the voltage across the resistor Roc has an 2:1 correspondence with the voltage to be input to the comparator 76, the error tolerance for the resistor Roc becomes two times.

Figure 1:
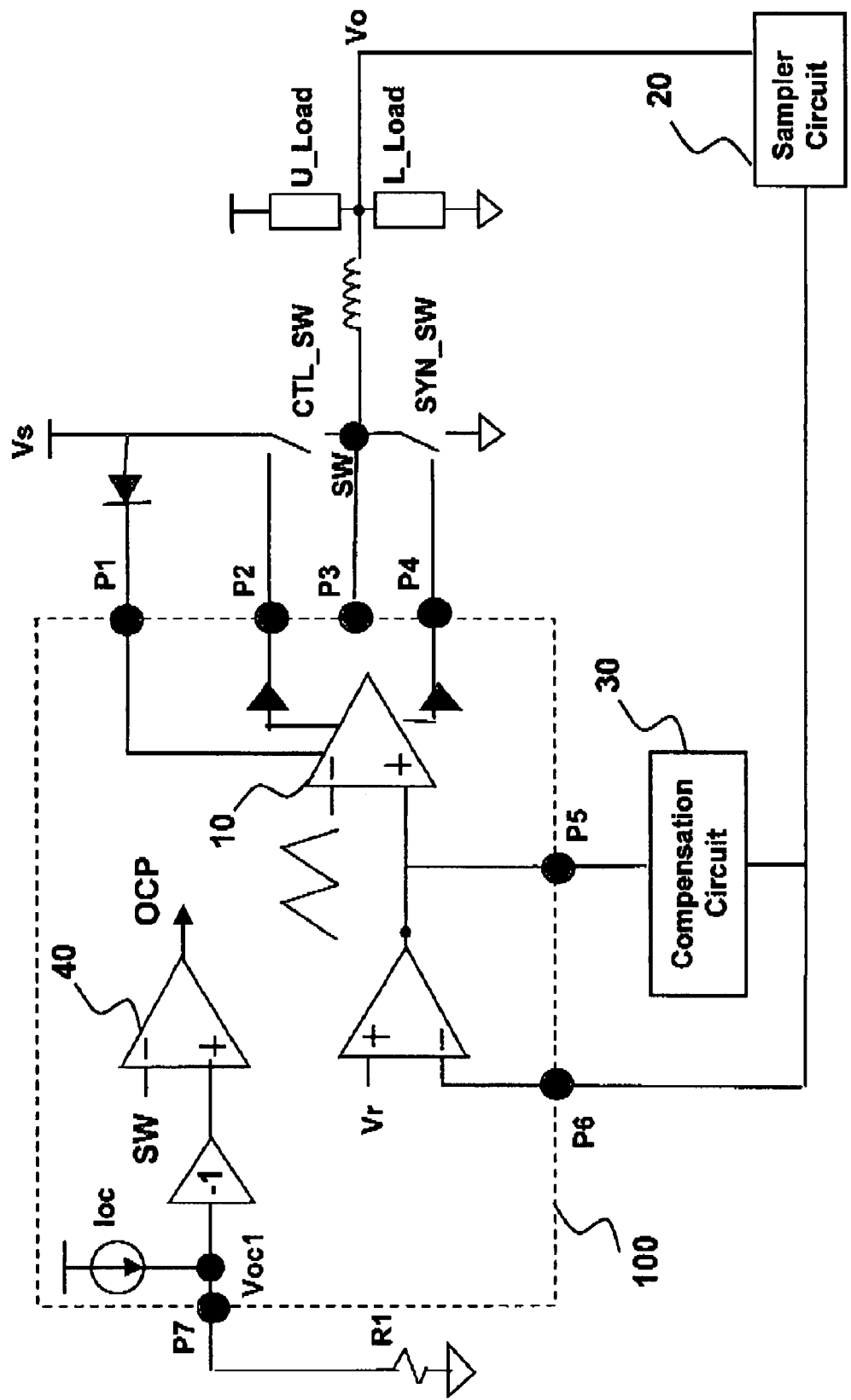
FIG. 1 is a circuit diagram schematically showing a conventional PWM circuit.
Figure 2:
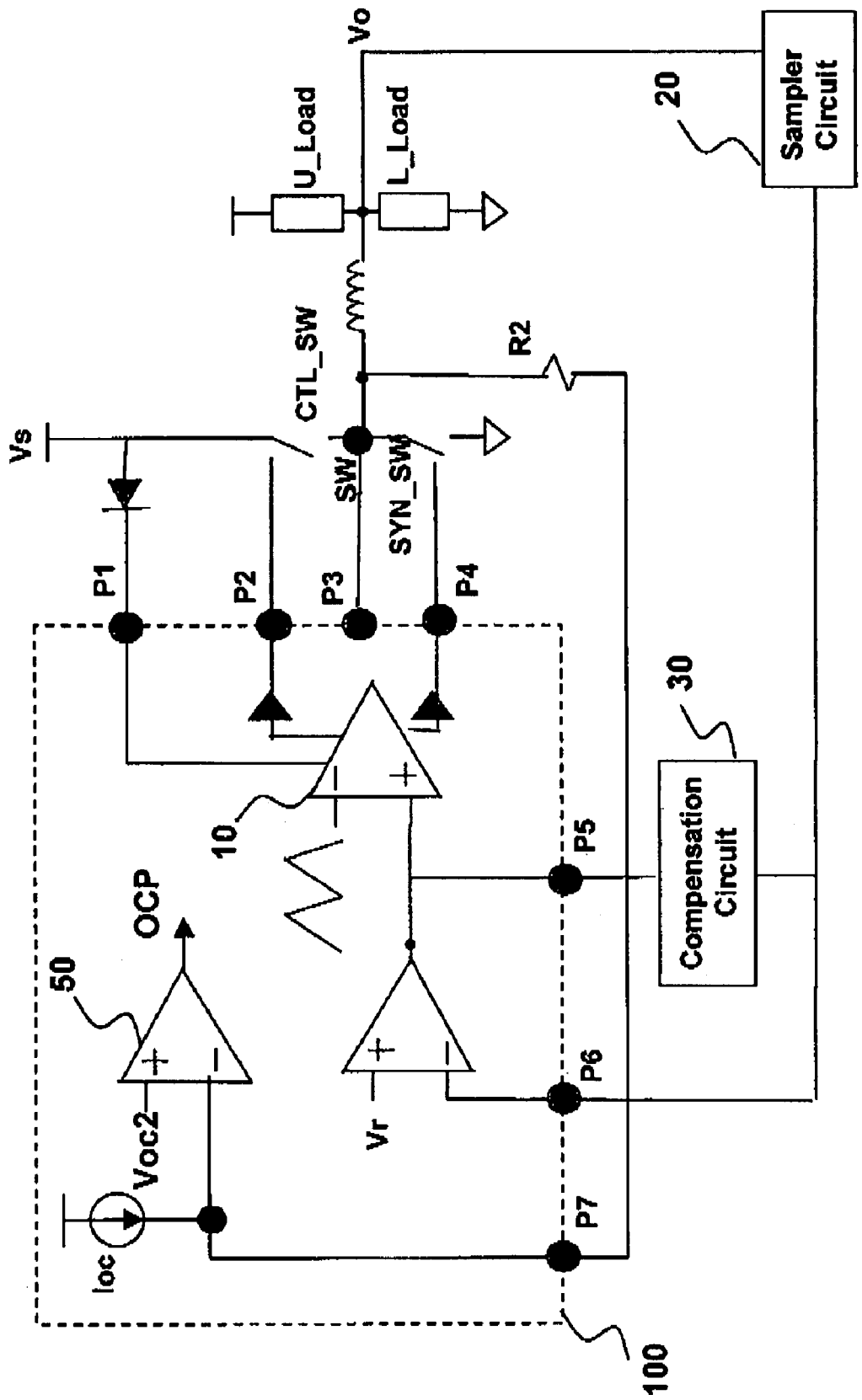
FIG. 2 is a circuit diagram schematically showing another conventional PWM circuit.

In addition to the above, in comparison with the conventional PWM circuits shown in FIGS. 1 and 2, the present invention provides a further advantage that the PWM circuit according to the present invention may provide a programming function that is not provided in the conventional PWM circuits. More specifically, the digital data stored in the storage circuit 74 may be used in other ways than setting the over current threshold. For example, assuming the PWM integrated circuit 200 has two or more operation modes, the digital output 77 of the storage circuit 74 may be used to determine the operation made. That is, by setting the resistance of the resistor Roc, a user of the PWM circuit may determine the operation mode of the PWM integrated circuit. Other types of programming/setting are also possible by means of the digital output 77. Moreover, since the ADC converter circuit 73 may be an N-bit conversion circuit, a user may achieve a rather complex programming function with $2^N$ possibilities by properly determining the resistance of the resistor Roc. The programming function may be combined with the setting of the over current threshold, or may be a stand-alone function. In the former case, as an example, assuming N=4, the two most significant bits may be used to set the over current threshold, while the two least significant bits may be used for other programming functions. In the latter case, the DAC circuit 75 and the comparator 76 may be omitted; the resistance of the resistor Roc is determined solely for the purpose of programming. The over current protection may be achieved by another circuit, such as, by providing two programming units 70 respectively electrically connected with the pins P2 and P4 of the PWM integrated circuit 200, one of which programming units 70 is for programming, and the other of which is for over current threshold setting.

Figure 6:
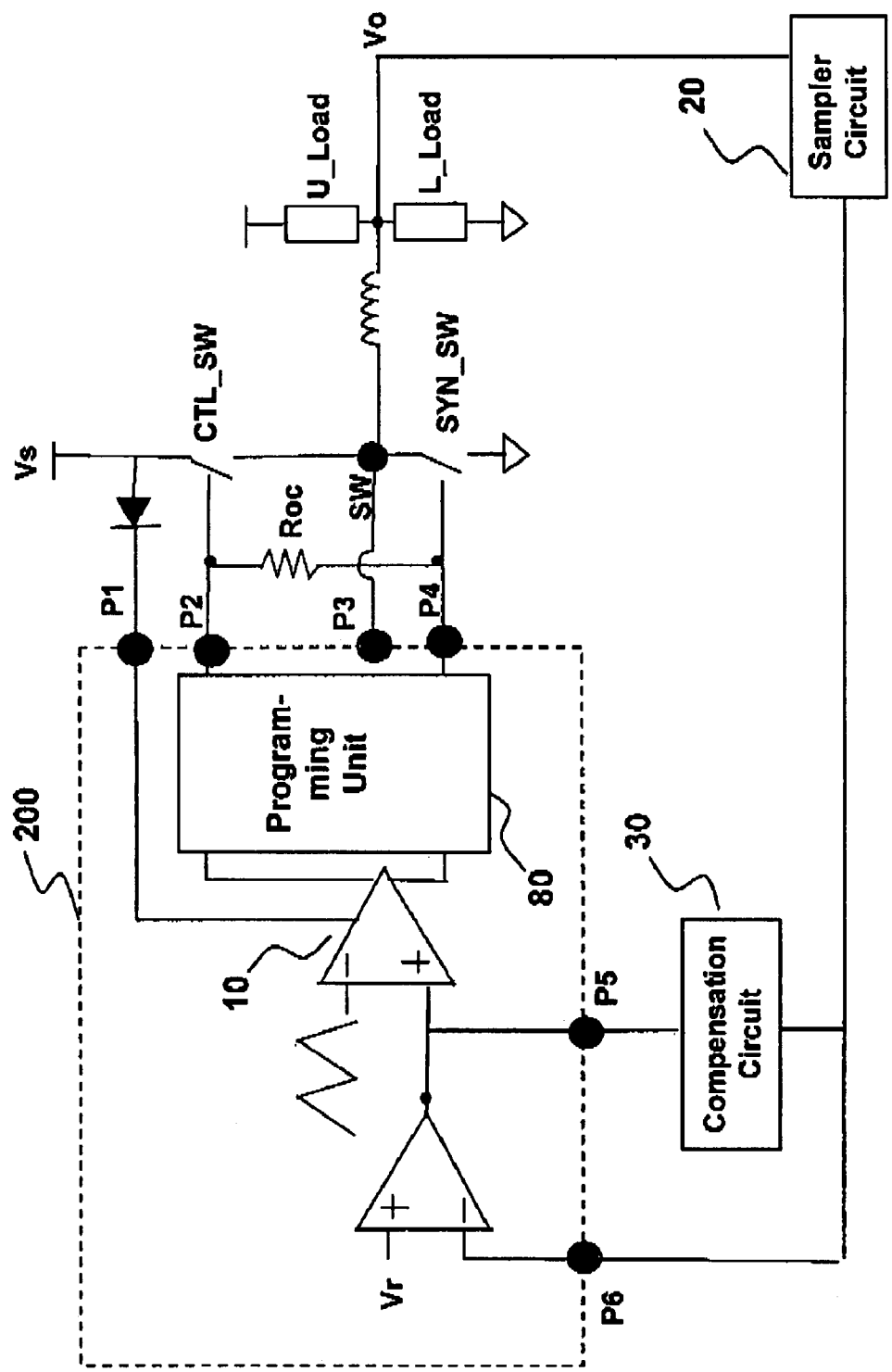
FIG. 6 is a circuit diagram schematically showing a PWM circuit according to a still other preferred embodiment of the present invention.

FIG. 6 shows another embodiment according to the present invention. As shown in the figure, the resistor Roc for setting the over current threshold is connected between the pins P2 and P4. Two embodiments of the programming unit 80 corresponding to such an arrangement are shown respectively in FIGS. 7 and 8.

Figure 7:
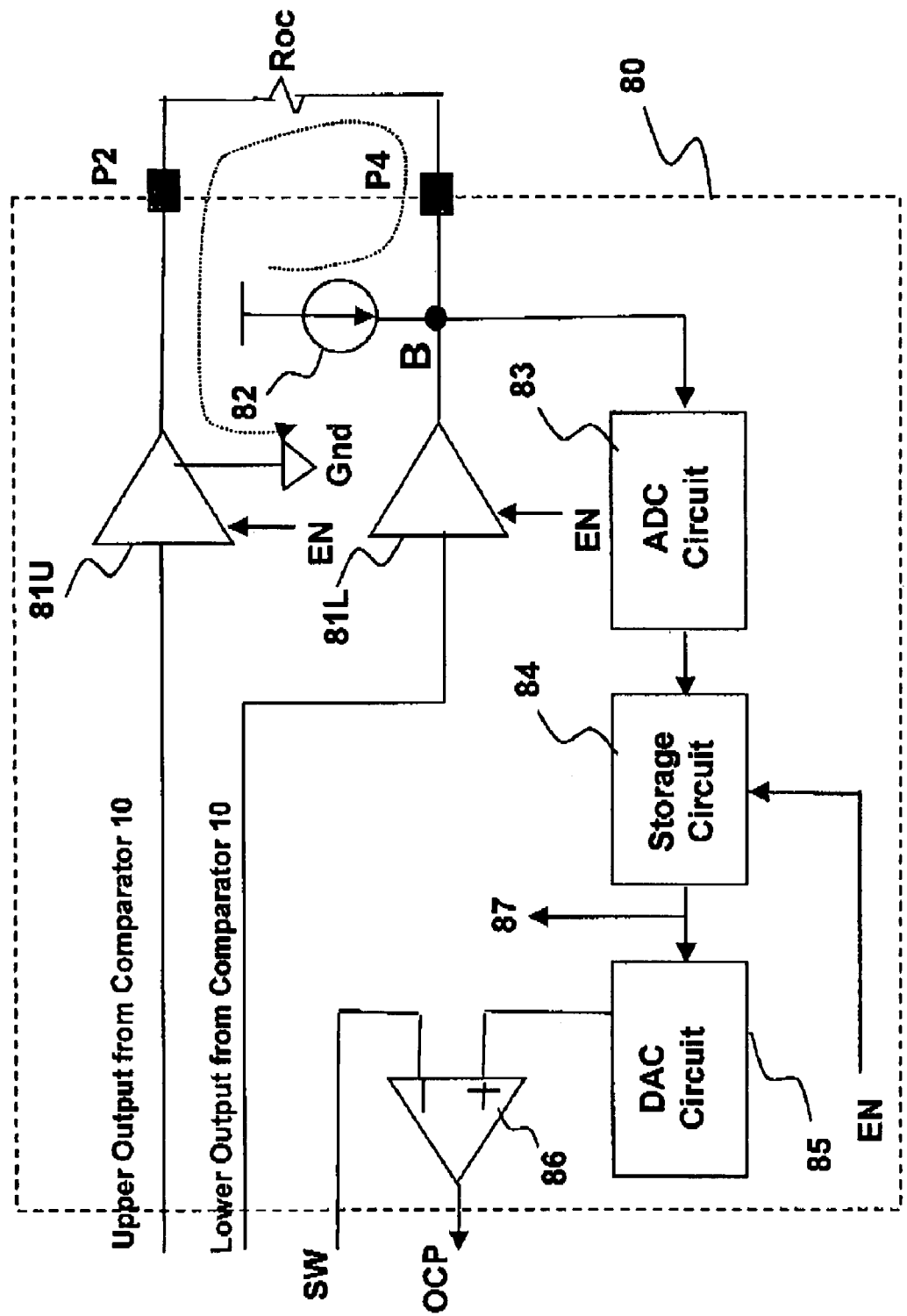
FIGS. 7 and 8 are circuit diagrams schematically showing the programming unit in the embodiment shown in FIG. 6.

As shown in FIG. 7, the programming unit 80 comprises two tri-state driver gates 81U and 81L, respectively receiving the upper and lower outputs of the comparator 10. The rest of the programming unit 80 is similar to that of the programming unit 70. When the enable signal EN is in an "enable" state, the tri-state driver gates 81U and 81L transmit the upper and lower outputs from the comparator 10 to the pins P2 and P4. When the enable signal EN is in a "disable" state, the programming unit 80 is set to the programming mode; the output terminal of the tri-state driver gate 81U is set to a low level, while the output terminal of the tri-state driver gate 81L is floating. The current provided by a constant current source 82 flows to ground through the path: node B-pin P4-resistor Roc-pin P2-ground path of the tri-state driver gate 81U-ground. Thus, a voltage across the resistor Roc is generated, which is the voltage at the node B. Similar to the programming unit 70, the voltage at the node B is converted by an ADC circuit 83, stored by a storage circuit 84, converted by a DAC circuit 85, and finally input to a comparator 86, to be compared with the voltage at the node SW for generating an over current protection signal OCP.

Figure 8:
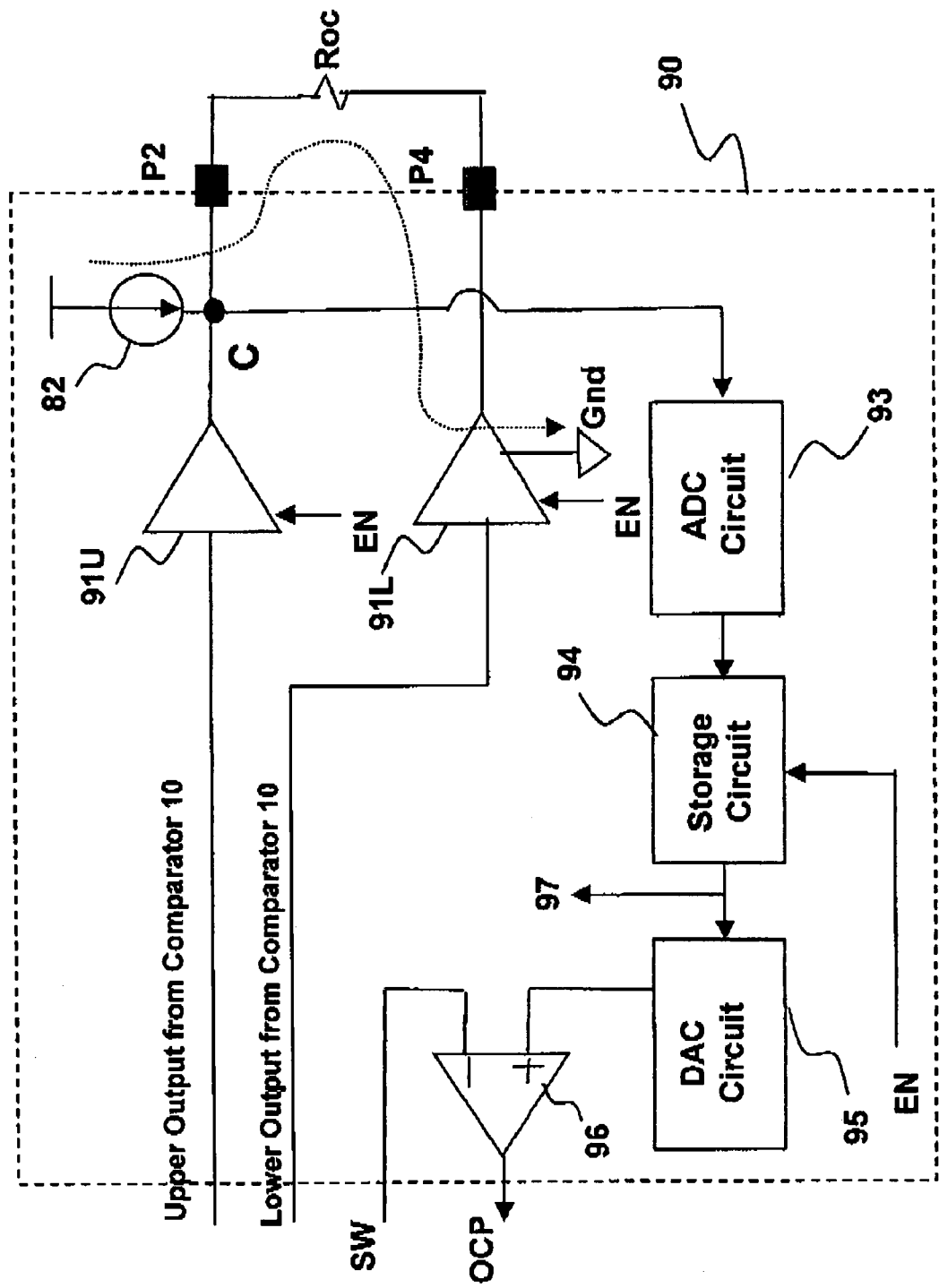

It is readily conceivable by one skilled in this art that the embodiment shown in FIG. 7 may be modified as the one shown in FIG. 8. In this embodiment, when the enable signal EN is in a "disable" state, the programming unit 80 is set to the programming mode; the output terminal of the tri-state driver gate 91U is floating, while the output terminal of the tri-state driver gate 91L is set to a low level. The current provided by a constant current source 92 flows to ground through the path: node C-pin P2-resistor Roc-pin P4-ground path of the tri-state driver gate 91L-ground. Thus, a voltage across the resistor Roc is generated, which is the voltage at the node C that may be used to generate an over current protection signal OCP in a manner similar to the foregoing embodiments.

The features, characteristics and effects of the present invention have been described with reference to its preferred embodiments, which are illustrative of the invention rather than limiting of the invention. Various other substitutions and modifications will occur to those skilled in the art, without departing from the spirit of the present invention. For example, in the described embodiments, the comparators 76, 86 and 96 are arranged in the programming unit so that the programming unit may generate an over current protection signal. However, other arrangements are possible; the comparators 76, 86 and 96 may be arranged outside the programming unit, so that the programming unit only generates an over current threshold, or digital signals 77, 87 and 97. As another example, the parameter setting circuit to determine the over current threshold or to provide other parameter setting/programming needs not necessarily be a resistor Roc, but instead may be other circuit elements capable of proving a voltage value. Therefore, all such substitutions and modifications are intended to be embraced within the scope of the invention as defined in the appended claims.

What is claimed is:

1. A pulse width modulation circuit comprising:
   a first and a second switch electrically connected with each other through a node between them, said node being capable of providing a voltage signal;
   a PWM integrated circuit, including
   (a) a plurality of pins including a first pin for controlling said first switch, a second pin for controlling said second switch, and a third pin for receiving said voltage signal from said node; and
   (b) a programming unit electrically connected with one of said first pin and second pin, for receiving a programming signal to program a parameter of said pulse width modulation integrated circuit; and
   a parameter setting circuit electrically connected with said one of said first pin and second pin.

2. The pulse width modulation circuit of claim 1, wherein said parameter setting circuit is a resistor, and said programming unit includes a constant current source electrically connected with said one of said first pin and second pin.

3. The pulse width modulation circuit of claim 1, wherein said pulse width modulation integrated circuit further includes a comparator, and wherein said programming unit is electrically connected with an output of said comparator, whereby during a normal operation mode, said programming unit transmits said output of said comparator to said one of said first pin and second pin, while in a programming mode, said programming unit receives said programming signal.

4. The pulse width modulation circuit of claim 3, wherein said programming unit switches between said normal operation mode and said programming mode according to an enable signal.

5. The pulse width modulation circuit of claim 1, wherein said pulse width modulation integrated circuit further includes a comparator, and wherein said programming unit includes a tri-state driver gate whose input is electrically connected with an output of said comparator and whose output is electrically connected with said one of said first pin and second pin; said tri-state driver gate being controlled by an enable signal to switch between a first mode wherein said output of said tri-state driver gate transmits a signal received at its said input, and a second mode wherein said output of said tri-state driver gate is floating.

6. The pulse width modulation circuit of claim 1, wherein said programming unit further includes a storage circuit to store said programming signal.

7. The pulse width modulation circuit of claim 6, wherein said programming signal is stored by said storage circuit, and the stored signal is compared with said voltage signal from said node to generate an over current protection signal thereby.

8. The pulse width modulation circuit of claim 1, wherein said programming unit further includes:
   an analogue-to-digital converter circuit electrically connected with said one of said first pin and second pin to receive and convert said programming signal into a digital signal,
   a storage circuit electrically connected with said analogue-to-digital converter circuit to store said digital signal, and
   a digital-to-analogue converter circuit electrically connected with said storage circuit to convert said digital signal into an analogous voltage signal.

9. The pulse width modulation circuit of claim 8, wherein said analogue-to-digital converter circuit converts said programming signal into a digital signal of at least one bit.

10. The pulse width modulation circuit of claim 1, wherein said programming unit includes:
    an analogue-to-digital converter circuit electrically connected with said one of said first pin and second pin to receive and convert said programming signal into a digital signal, and
    a storage circuit electrically connected with said analogue-to-digital converter circuit to store said digital signal, and providing an digital output to program a parameter in said pulse width modulation integrated circuit.

11. The pulse width modulation circuit of claim 10, wherein said analogue-to-digital converter circuit converts said programming signal into a digital signal of at least one bit.

12. The pulse width modulation circuit of claim 1, wherein said first switch is electrically connected between a voltage source and said node, and said second switch is electrically connected between said node and ground, and wherein said one of said first pin and second pin is said first pin.

13. The pulse width modulation circuit of claim 1, wherein said first switch is electrically connected between a voltage source and said node, and said second switch is electrically connected between said node and ground, and wherein said one of said first pin and second pin is said second pin.

14. A pulse width modulation circuit comprising:
    a first and a second switch electrically connected with each other through a node between them, said node being capable of providing a voltage signal;
    a PWM integrated circuit, including
    (a) a plurality of pins including a first pin for controlling said first switch, a second pin for controlling said second switch, and a third pin for receiving said voltage signal from said node; and
    (b) a programming unit electrically connected between said first pin and said second pin for receiving a programming signal to program a parameter of said pulse width modulation integrated circuit; and
    a parameter setting circuit electrically connected between said first pin and said second pin.

15. The pulse width modulation circuit of claim 14, wherein said parameter setting circuit is a resistor, and said pulse width modulation integrated circuit further includes a constant current source electrically connected with said first pin.

16. The pulse width modulation circuit of claim 14, wherein said parameter setting circuit is a resistor, and said pulse width modulation integrated circuit further includes a constant current source electrically connected with said second pin.

17. The pulse width modulation circuit of claim 14, wherein said pulse width modulation integrated circuit further includes a comparator having at least two outputs, and wherein said programming unit is electrically connected with said two outputs of said comparator, whereby during a normal operation mode, said programming unit transmits said two outputs of said comparator to said first pin and said second pin, respectively, while in a programming mode, said programming unit receives said programming signal.

18. The pulse width modulation circuit of claim 17, wherein said programming unit switches between said normal operation mode and said programming mode according to an enable signal.

19. The pulse width modulation circuit of claim 14, wherein said pulse width modulation integrated circuit further includes a comparator having at least two outputs, and wherein said programming unit includes at least two tri-state driver gates whose inputs are electrically connected with one and the other of said two outputs of said comparator, respectively, and whose outputs are electrically connected with said first pin and said second pin, respectively; said two tri-state driver gates being controlled by an enable signal to switch between a first mode wherein said output of each of said tri-state driver gates transmits a signal received at its said input, and a second mode wherein said output of one of said tri-state driver gates is floating and said output of the other of said tri-state driver gates is at a low level.

20. The pulse width modulation circuit of claim 14, wherein said programming unit further includes a storage circuit to store said programming signal.

21. The pulse width modulation circuit of claim 20, wherein said programming signal is stored by said storage circuit, and the stored programming signal is compared with said voltage signal from said node to generate an over current protection signal thereby.

22. The pulse width modulation circuit of claim 14, wherein said programming unit further includes:
    an analogue-to-digital converter circuit to receive and convert said programming signal into a digital signal,
    a storage circuit electrically connected with said analogue-to-digital converter circuit to store said digital signal, and
    a digital-to-analogue converter circuit electrically connected with said storage circuit to convert said digital signal into an analogous voltage signal.

23. The pulse width modulation circuit of claim 22, wherein said analogue-to-digital converter circuit converts said programming signal into a digital signal of at least one bit.

24. The pulse width modulation circuit of claim 14, wherein said programming unit includes:
    an analogue-to-digital converter circuit to receive and convert said programming signal into a digital signal, and
    a storage circuit electrically connected with said analogue-to-digital converter circuit to store said digital signal, and providing an digital output to program a parameter in said pulse width modulation integrated circuit.

25. The pulse width modulation circuit of claim 24, wherein said analogue-to-digital converter circuit converts said programming signal into a digital signal of at least one bit.

26. A pulse width modulation integrated circuit comprising:
    a comparator generating at least two outputs;
    at least two pins electrically connected with said two outputs, respectively; and
    a programming unit electrically connected with at least one of said two pins for receiving an external programming signal to program a parameter of the pulse width modulation integrated circuit,
    wherein said programming unit is electrically connected with at least one of said two outputs of said comparator, and is capable of switching between a first mode wherein said programming unit transmits at least one of said two outputs of said comparator to one of said two pins, and a second mode wherein said programming unit receives said external programming signal.

27. A pulse width modulation integrated circuit comprising:
    a comparator generating at least two outputs;
    at least two pins electrically connected with said two outputs, respectively; and
    a programming unit electrically connected with at least one of said two pins for receiving an external programming signal to program a parameter of the pulse width modulation integrated circuit,
    wherein said programming unit includes a tri-state driver gate whose input is electrically connected with one of said two outputs of said comparator, and whose output is electrically connected with one of said pins; said tri-state driver gate being capable of switching between a first mode wherein said output of said tri-state driver gate transmits a signal received at its said input, and a second mode wherein said output of said tri-state driver gate is floating.

28. The pulse width modulation circuit of claim 27, wherein said programming unit includes at least two tri-state driver gates whose inputs are electrically connected with one and the other of said two outputs of said comparator, respectively, and whose outputs are electrically connected with one and the other of said two pins, respectively; said two tri-state driver gates being capable of switching between a first mode wherein said output of each of said tri-state driver gates transmits a signal received at its said input, and a second mode wherein said output of one of said tri-state driver gates is floating and said output of the other of said tri-state driver gates is at a low level.

29. A pulse width modulation integrated circuit comprising:
    a comparator generating at least two outputs;
    at least two pins electrically connected with said two outputs, respectively; and
    a programming unit electrically connected with at least one of said two pins for receiving an external programming signal to program a parameter of the pulse width modulation integrated circuit,
    wherein said programming unit further includes a storage circuit to store said external programming signal.

30. The pulse width modulation circuit of claim 29, wherein said external programming signal is stored by said storage circuit, and the stored programming signal is compared with a voltage signal to generate an over current protection signal thereby.

31. A pulse width modulation integrated circuit comprising:
    a comparator generating at least two outputs;
    at least two pins electrically connected with said two outputs, respectively; and
    a programming unit electrically connected with at least one of said two pins for receiving an external programming signal to program a parameter of the pulse width modulation integrated circuit,
    wherein said programming unit further includes:
        an analogue-to-digital converter circuit to receive and convert said external programming signal into a digital signal,
        a storage circuit electrically connected with said analogue-to-digital converter circuit to store said digital signal, and
        a digital-to-analogue converter circuit electrically connected with said storage circuit to convert said digital signal into an analogous voltage signal.

32. The pulse width modulation circuit of claim 31, wherein said analogue-to-digital converter circuit converts said external programming signal into a digital signal of at least one bit.

33. A pulse width modulation integrated circuit comprising:

a comparator generating at least two outputs;

at least two pins electrically connected with said two outputs, respectively; and a programming unit electrically connected with at least one of said two pins for receiving an external programming signal to program a parameter of the pulse width modulation integrated circuit, wherein said programming unit includes:

an analogue-to-digital converter circuit to receive and convert said programming signal into a digital signal, and a storage circuit electrically connected with said analogue-to-digital converter circuit to store said digital signal, and providing an digital output to program a parameter in said pulse width modulation integrated circuit.

34. The pulse width modulation circuit of claim 33, wherein said analogue-to-digital converter circuit converts said programming signal into a digital signal of at least one bit.

* * * * *

(12) EX PARTE REEXAMINATION CERTIFICATE (8284th)
United States Patent
Chen

(10) Number: US 7,315,190 C1
(45) Certificate Issued: May 31, 2011

(54) PWM CIRCUIT AND PWM INTEGRATED CIRCUIT FOR USE IN PWM CIRCUIT

(75) Inventor: Isaac Y. Chen, Jhubei (TW)

(73) Assignee: Richtek Technology Corporation, Chupei, Hsin-Chu (TW)

Reexamination Request:
No. 90/011,180, Sep. 16, 2010

Reexamination Certificate for:
Patent No.: 7,315,190
Issued: Jan. 1, 2008
Appl. No.: 11/454,459
Filed: Jun. 16, 2006

(51) Int. Cl.
*H03K 3/017* (2006.01)

(52) U.S. Cl. .................................. 327/172; 327/175
(58) Field of Classification Search ............... 327/172
See application file for complete search history.

(56) References Cited

U.S. PATENT DOCUMENTS

2006/0261678 A1  11/2006  Khayat

OTHER PUBLICATIONS

Intersil ISL6545 Data Sheet.
Intersil ISL6520 Data Sheet.

*Primary Examiner*—Pia Tibbits

(57) ABSTRACT

The present invention discloses a PWM integrated circuit which may receive a programming signal without any extra pin. The PWM integrated circuit comprises: a comparator having two outputs; two pins respectively electrically connected with the two outputs; and a programming unit electrically connected with at least one of the two pins for setting a parameter inside the PWM integrated circuit. The two pins of the PWM integrated circuit may be used to respectively control a control switch and a synchronous switch, constituting a PWM circuit for generating PWM signals.

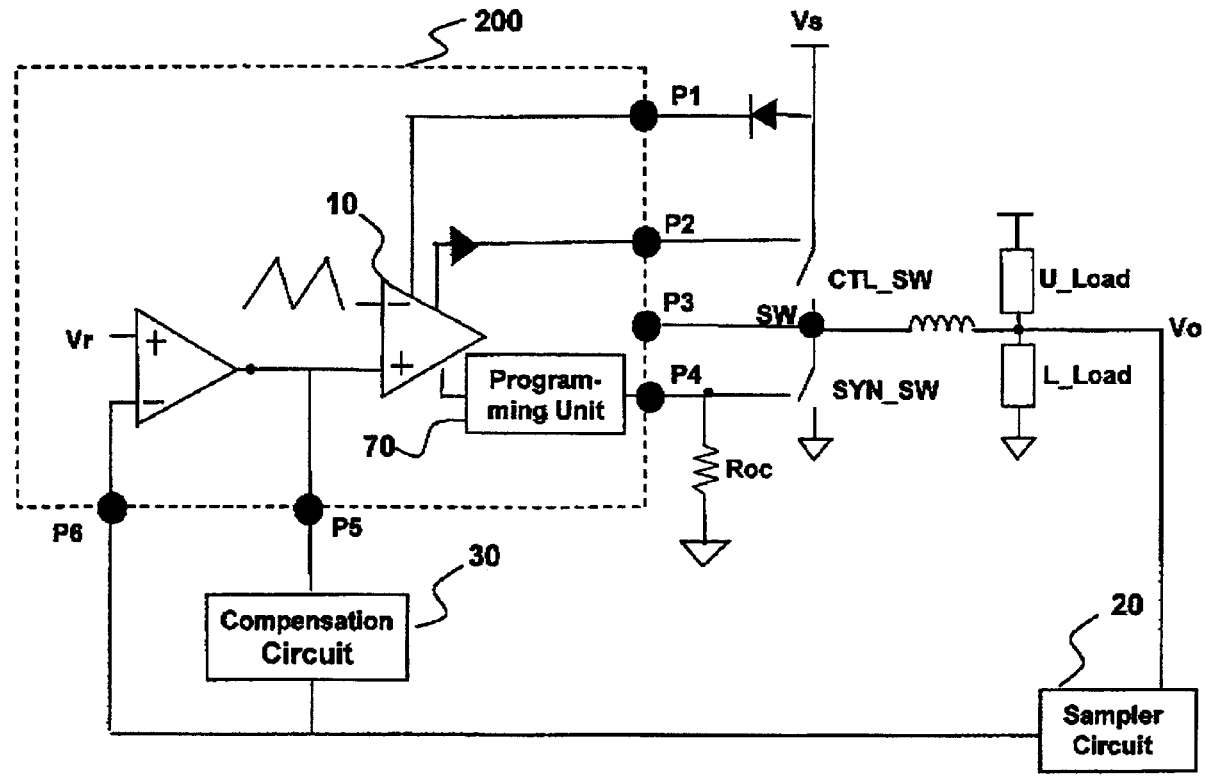

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-11, 26 and 27 is confirmed. Claims 12-25 and 28-34 were not reexamined.

* * * * *

(12) EX PARTE REEXAMINATION CERTIFICATE (8786th)
United States Patent
Chen

(10) Number: US 7,315,190 C2
(45) Certificate Issued: Jan. 3, 2012

(54) PWM CIRCUIT AND PWM INTEGRATED CIRCUIT FOR USE IN PWM CIRCUIT

(75) Inventor: Isaac Y. Chen, Jhubei (TW)

(73) Assignee: Richtek Technology Corporation, Chupei, Hsin-Chu (TW)

Reexamination Request:
No. 90/011,486, Feb. 14, 2011

Reexamination Certificate for:
| | |
|---|---|
| Patent No.: | 7,315,190 |
| Issued: | Jan. 1, 2008 |
| Appl. No.: | 11/454,459 |
| Filed: | Jun. 16, 2006 |

Reexamination Certificate C1 7,315,190 issued May 31, 2011

(51) Int. Cl.
*H03K 3/017* (2006.01)

(52) U.S. Cl. ........................................ 327/172; 327/175

(58) Field of Classification Search ........................ None
See application file for complete search history.

(56) References Cited

To view the complete listing of prior art documents cited during the proceeding for Reexamination Control Number 90/011,486, please refer to the USPTO's public Patent Application Information Retrieval (PAIR) system under the Display References tab.

*Primary Examiner*—Pia Tibbits

(57) ABSTRACT

The present invention discloses a PWM integrated circuit which may receive a programming signal without any extra pin. The PWM integrated circuit comprises: a comparator having two outputs; two pins respectively electrically connected with the two outputs; and a programming unit electrically connected with at least one of the two pins for setting a parameter inside the PWM integrated circuit. The two pins of the PWM integrated circuit may be used to respectively control a control switch and a synchronous switch, constituting a PWM circuit for generating PWM signals.

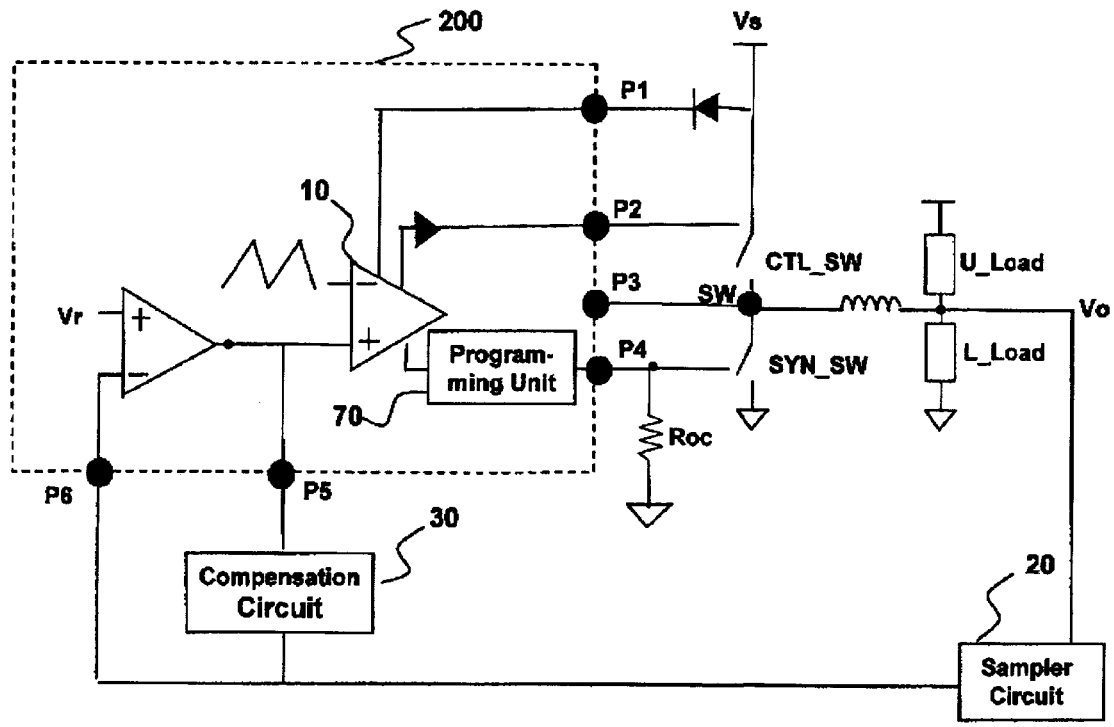

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-11, 26 and 27 is confirmed. Claims 12-25 and 28-34 were not reexamined.

\* \* \* \* \*